(12) United States Patent
Hsu et al.

(10) Patent No.: US 11,696,391 B2
(45) Date of Patent: Jul. 4, 2023

(54) WIRING SUBSTRATE AND METHOD OF MANUFACTURING THE SAME

(71) Applicants: Avary Holding(Shenzhen)Co., Ltd., Shenzhen (CN); HongQiSheng Precision Electronics(QinHuangdao)Co., Ltd., Hebei Province (CN); Garuda Technology Co., Ltd., New Taipei (TW)

(72) Inventors: Mao-Feng Hsu, Taoyuan (TW); Zhi-Hong Yang, Guangzhou (CN)

(73) Assignees: AVARY HOLDING (SHENZHEN) CO., LTD., Shenzhen (CN); HONGQISHENG PRECISION ELECTRONICS (QINHUANGDAO) CO., LTD., Hebei Province (CN); GARUDA TECHNOLOGY CO., LTD, New Taipei (TW)

( * ) Notice: Subject to any disclaimer, the term of this patent is extended or adjusted under 35 U.S.C. 154(b) by 0 days.

(21) Appl. No.: 17/457,025

(22) Filed: Nov. 30, 2021

(65) Prior Publication Data

US 2023/0127697 A1     Apr. 27, 2023

(30) Foreign Application Priority Data

Oct. 25, 2021   (CN) .......................... 202111238769.3

(51) Int. Cl.
*H05K 1/02* (2006.01)
*H05K 1/03* (2006.01)
(Continued)

(52) U.S. Cl.
CPC ........... *H05K 1/024* (2013.01); *H05K 1/0242* (2013.01); *H05K 3/4661* (2013.01); *H05K 3/4688* (2013.01); *H05K 2201/0723* (2013.01)

(58) Field of Classification Search
CPC ...... H05K 1/02; H05K 1/0231; H05K 1/0239; H05K 1/0251; H05K 1/0281;
(Continued)

(56) References Cited

U.S. PATENT DOCUMENTS 9,437,482 B2 *    9/2016   Pagaila ................... H01L 24/49
2013/0057365 A1 *  3/2013   Mizushima ............. H01P 5/028
                                                              333/238
(Continued)

FOREIGN PATENT DOCUMENTS

CN       102143647 A      8/2011
TW       201417646 A      5/2014
(Continued)

*Primary Examiner* — Xiaoliang Chen
(74) *Attorney, Agent, or Firm* — Muncy, Geissler, Olds & Lowe, P.C.

(57) ABSTRACT

A wiring substrate includes a first insulating layer with a first opening, a second insulating layer with a second opening, a high-frequency wiring layer, a first wiring layer, a second wiring layer, and a plurality of conductive pillars. The high-frequency wiring layer including a high-frequency trace is sandwiched between the first insulating layer and the second insulating layer. The first opening and the second opening expose two sides of the high-frequency trace respectively. The high-frequency trace has a smooth surface which is not covered by the first insulating layer and the second insulating layer and has the roughness ranging between 0.1 and 2 μm. The first insulating layer and the second insulating layer are all located between the first wiring layer and the second wiring layer. The conductive pillars are disposed in the second insulating layer and connected to the high-frequency trace.

15 Claims, 14 Drawing Sheets

(51) Int. Cl.
*H05K 3/42* (2006.01)
*H05K 3/46* (2006.01)

(58) Field of Classification Search
CPC .... H05K 1/0298; H05K 1/024; H05K 1/0242; H05K 1/03; H05K 1/036; H05K 1/115; H05K 1/116; H05K 3/0035; H05K 3/0094; H05K 3/42; H05K 3/421; H05K 3/429; H05K 3/46; H05K 3/4602; H05K 3/4661; H05K 3/4688; H05K 3/49823; H05K 2201/0187; H05K 2201/0191; H05K 2201/0219; H05K 2201/0723; H05K 2201/0959; H05K 2201/09645; H05K 2201/09854
USPC .......................... 174/256; 333/238; 427/123
See application file for complete search history.

(56) References Cited

U.S. PATENT DOCUMENTS

2022/0117085 A1\* 4/2022 Higashi .................. H05K 3/429
2022/0232695 A1\* 7/2022 Huang ................... H05K 1/115

FOREIGN PATENT DOCUMENTS

| TW | 201711536 A | 3/2017 |
| TW | 201808067 A | 3/2018 |

\* cited by examiner

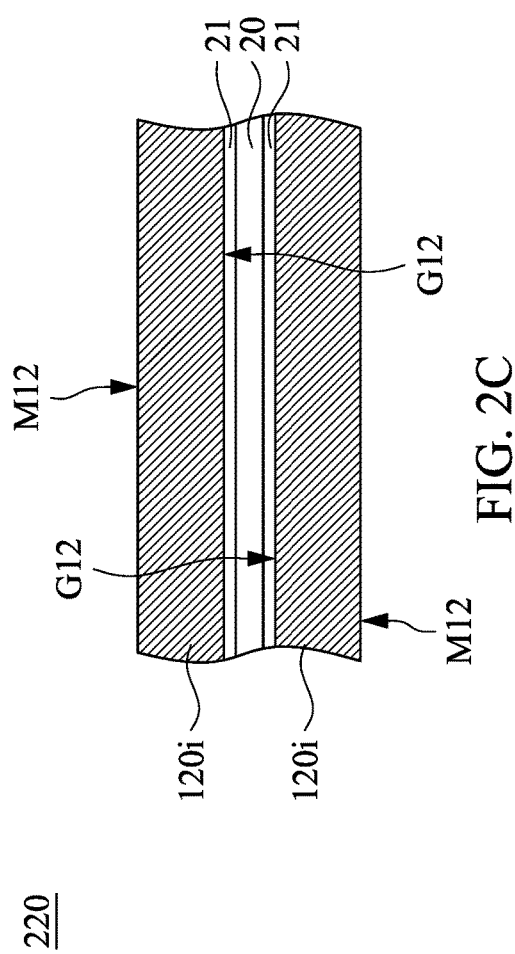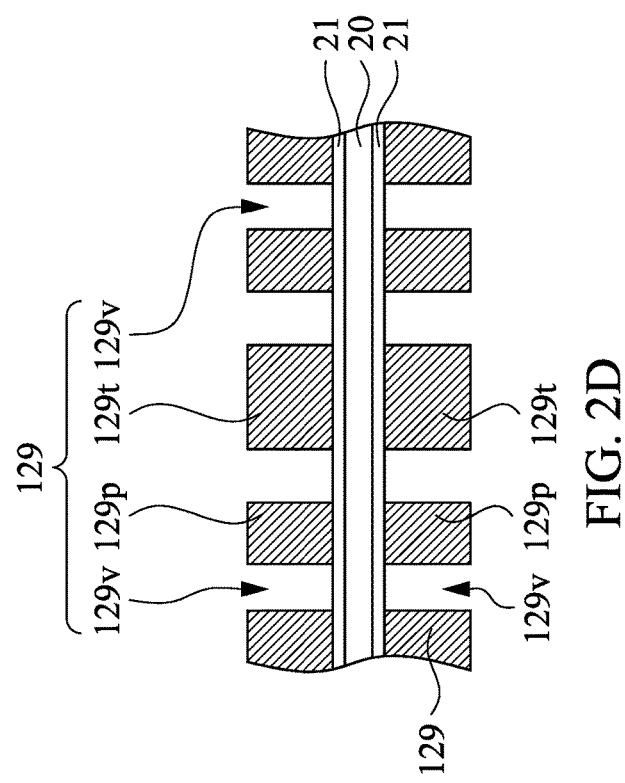

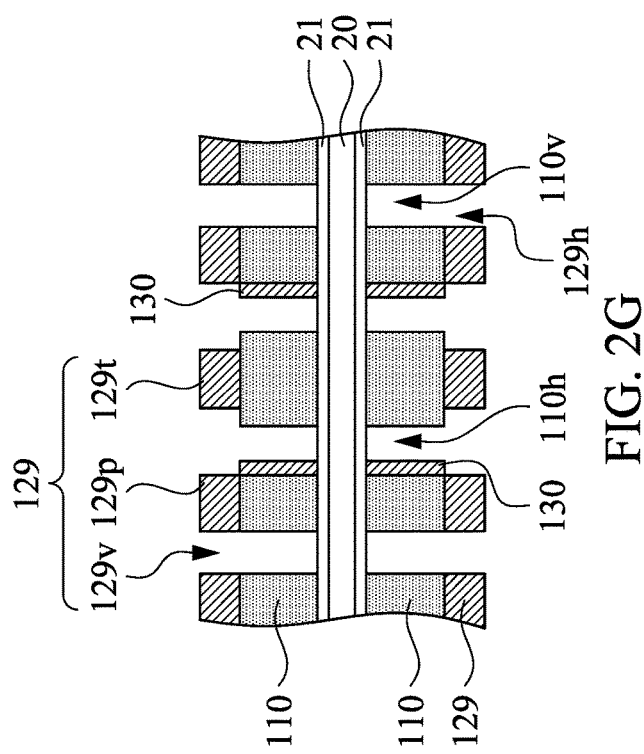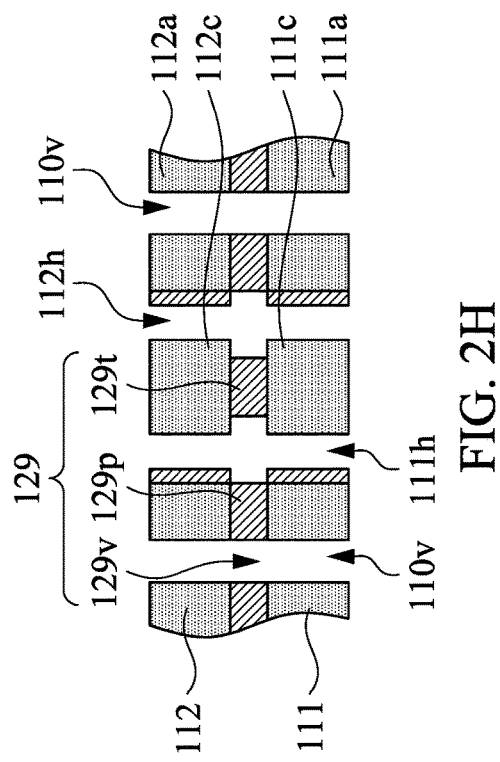

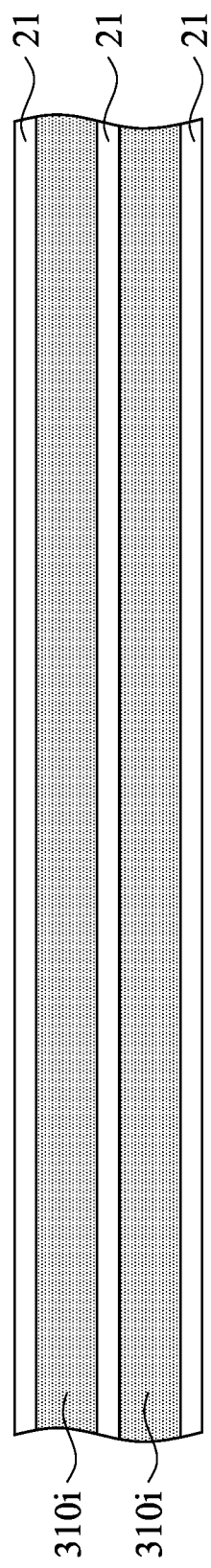
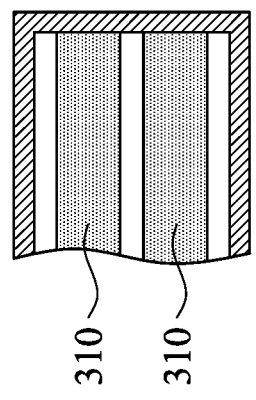
FIG. 3A
FIG. 3B

WIRING SUBSTRATE AND METHOD OF MANUFACTURING THE SAME

CROSS-REFERENCE TO RELATED APPLICATION

This application claims priority to China Application Serial Number 202111238769.3, filed Oct. 25, 2021, which is herein incorporated by reference in its entirety.

BACKGROUND

Technical Field

The present disclosure relates to a wiring substrate and method of manufacturing the same. More particularly, the present disclosure relates to a wiring substrate suitable for transmitting a high-frequency signal and method of manufacturing the same.

Description of Related Art

Current communication devices, such as smartphones and tablets, use increasingly high frequency, so that the high-frequency signal transmitted by the communication device is susceptible to dielectric loss and thus attenuated significantly. In order to reduce the influence of dielectric loss, the insulating layers of the wiring board in the communication device are usually made of a material with low relative permittivity, which is usually liquid crystal polymer (LCP) or teflon. However, the relative permittivities of both LCP and Teflon are difficult to satisfy the high-frequency demand for the current communication devices.

SUMMARY

At least one embodiment of the disclosure provides a wiring substrate including a high-frequency trace which is suitable for transmitting the high-frequency signal.

At least one embodiment of the disclosure provides a method of manufacturing the above wiring substrate.

A wiring substrate according to at least one embodiment of the disclosure includes a first insulating layer, a first conductive layer, a second insulating layer, a second conductive layer, a high-frequency wiring layer, a first wiring layer, a second wiring layer and a plurality of conductive columns. The first insulating layer has a first opening. The first conductive layer is formed on the sidewall of the first opening. The second insulating layer has a second opening. The second conductive layer is formed on the sidewall of the second opening. The high-frequency wiring layer is sandwiched between the first insulating layer and the second insulating layer, in which the high-frequency wiring layer includes a high-frequency trace. The high-frequency trace has a first surface and a second surface opposite to the first surface. The first opening exposes the first surface, and the second opening exposes the second surface. The first surface has a first smooth surface that is not covered by the first insulating layer, and the second surface has a second smooth surface that is not covered by the second insulating layer, in which the first smooth surface and the second smooth surface have the roughness ranging between 0.1 μm and 2 μm apiece. The first wiring layer includes a first return layer, and the second wiring layer includes a second return layer and a signal wiring layer. The signal wiring layer is located at the peripheral region of the second return layer, in which the first insulating layer and the second insulating layer are both located between the first wiring layer and the second wiring layer. The first opening and the second opening located between the first return layer and the second return layer form a hollow cavity. The high-frequency trace is located in the hollow cavity. The high-frequency trace, the first return layer and the second return layer overlap and do not touch each other. The conductive columns are disposed in the second insulating layer, in which the conductive columns are connected to the high-frequency trace and the signal wiring layer, but not electrically connected to the second return layer.

A method of manufacturing a wiring substrate according to at least one embodiment of the disclosure includes forming a high-frequency wiring layer including a high-frequency trace, in which the high-frequency trace has a first surface and a second surface opposite to the first surface. A first insulating layer having a first opening and a second insulating layer having a second opening are formed. A first conductive layer is formed on the sidewall of the first opening, and a second conductive layer is formed on the sidewall of the second opening. The first insulating layer is disposed on the high-frequency wiring layer, in which the first opening exposes the first surface. The first surface has a first smooth surface which is not covered by the first insulating layer, where the roughness of the first smooth surface ranges between 0.1 μm and 2 μm. The second insulating layer is disposed on the high-frequency wiring layer, in which the second opening exposes the second surface. The second surface has a second smooth surface which is not covered by the second insulating layer, where the roughness of the second smooth surface ranges 0.1 μm and 2 μm. Afterward, a first wiring layer is formed on the first insulating layer, in which the first wiring layer includes a first return layer. A second wiring layer is formed on the second insulating layer, in which the second wiring layer includes a second return layer. The first opening and the second opening located between the first return layer and the second return layer form a hollow cavity, and the high-frequency trace is located in the hollow cavity. The high-frequency trace, the first return layer and the second return layer overlap and do not touch each other.

Based on the above, the high-frequency trace is located in the hollow cavity which can contain the air, where the air has the low relative permittivity (which is about 1), which is lower than the relative permittivity of each of LCP and teflon. Hence, the dielectric loss can be reduced, so as to reduce the attenuation of the high-frequency signal due to dielectric loss, thereby improving the transmission quality of the wiring substrate.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 2A to 2J are schematic views of a method of manufacturing the wiring substrate shown in FIG. 1A.

FIGS. 3A to 3I are schematic cross-sectional views of a method of manufacturing a wiring substrate according to another embodiment of this disclosure.

DETAILED DESCRIPTION

Figure 1A:
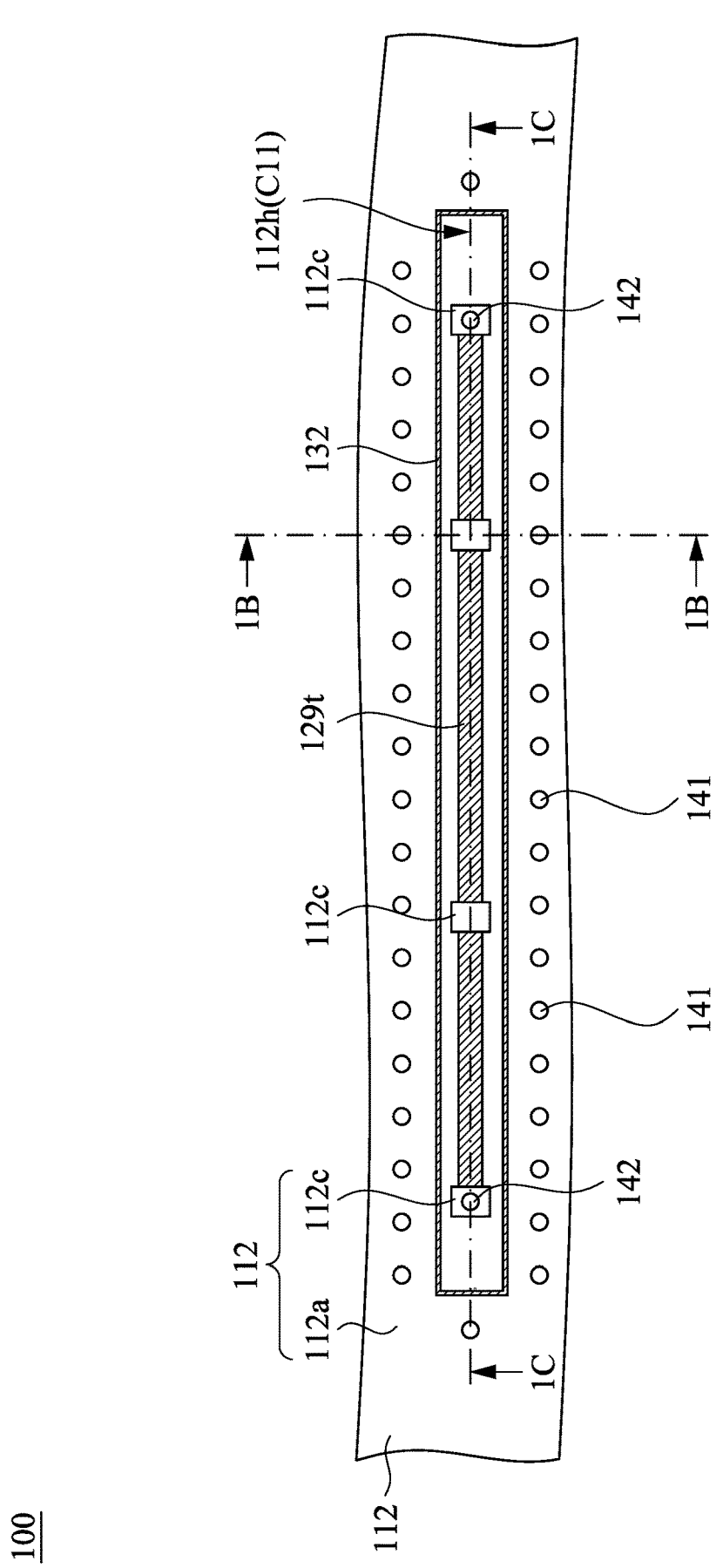
FIG. 1A is a schematic top view of a wiring substrate according to at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions, and the quantity of some elements will be reduced. Accordingly, the description and explanation of the following embodiments are not limited to the quantity, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

Figure 1B:
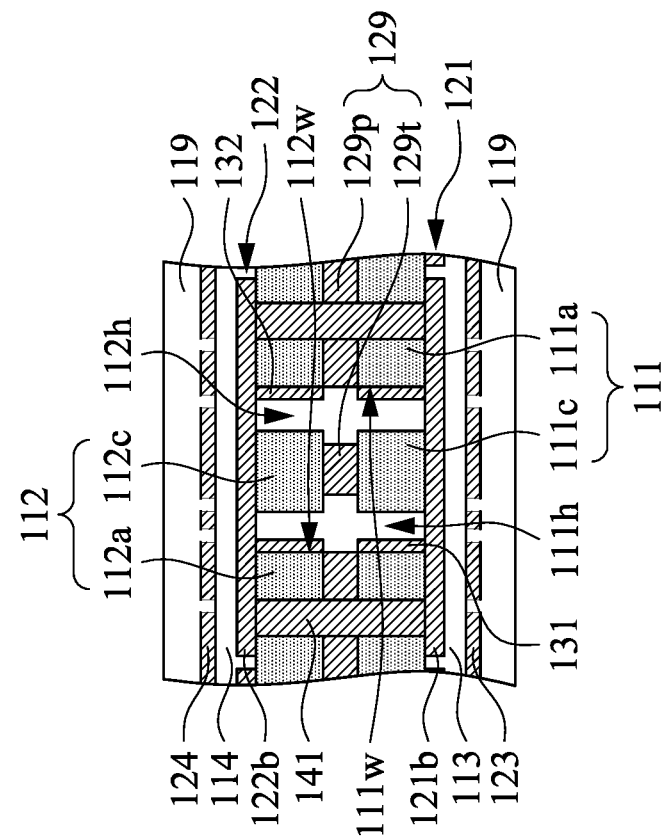
FIG. 1B is a schematic cross-sectional view along a line 1B-1B shown in FIG. 1A.
Figure 1C:
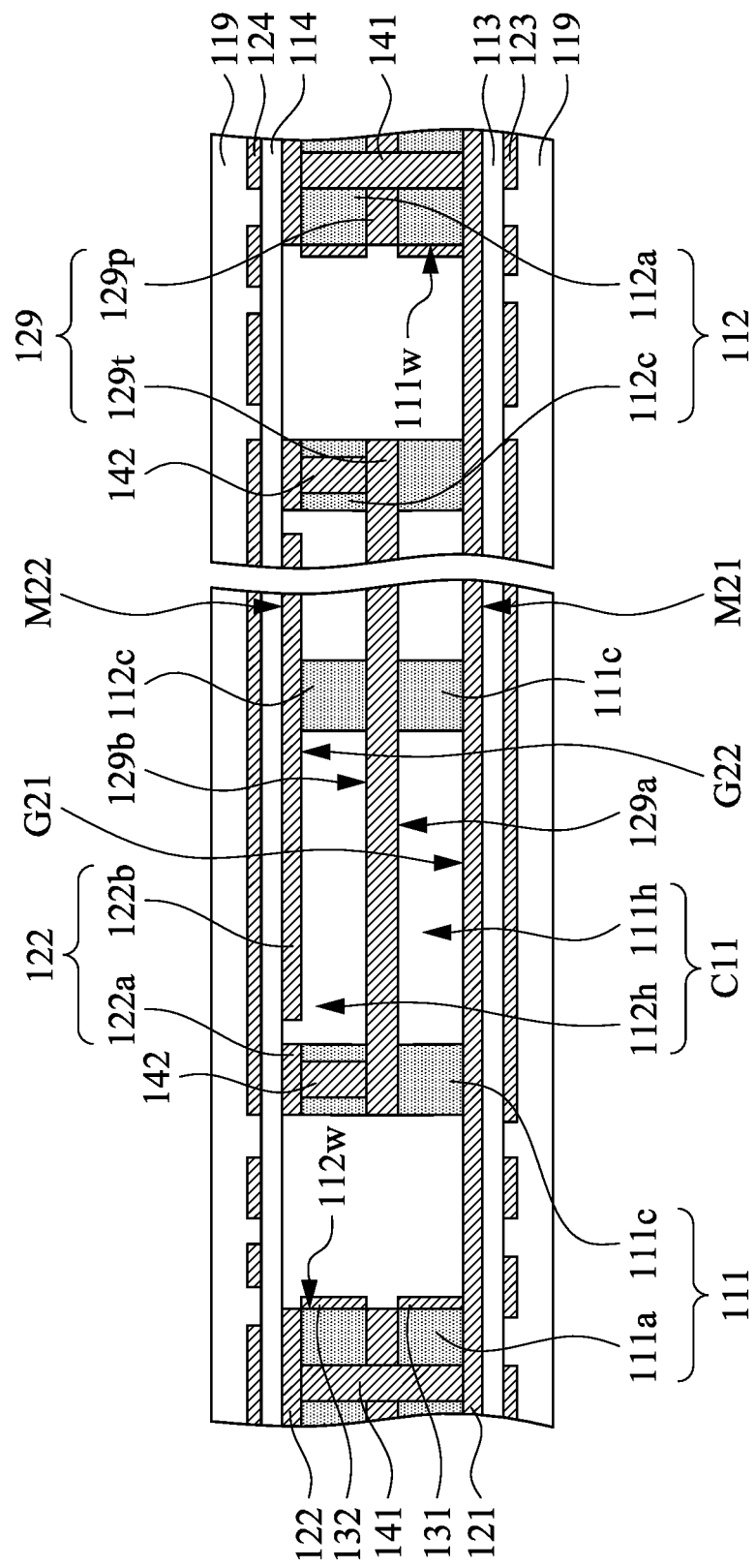
FIG. 1C is a schematic cross-sectional view along a line 1C-1C shown in FIG. 1A.

FIG. 1A is a schematic top view of a wiring substrate according to at least one embodiment of this disclosure. FIG. 1B is a schematic cross-sectional view along a line 1B-1B shown in FIG. 1A. FIG. 1C is a schematic cross-sectional view along a line 1C-1C shown in FIG. 1A. Referring to FIGS. 1A to 1C, the wiring substrate 100 may be a rigid wiring board or a flexible wiring board, and the wiring substrate 100 includes a first insulating layer 111, a second insulating layer 112, a high-frequency wiring layer 129, a first wiring layer 121 and a second wiring layer 122.

The high-frequency wiring layer 129 is sandwiched between the first insulating layer 111 and the second insulating layer 112, and the high-frequency wiring layer 129 can directly touch the first insulating layer 111 and the second insulating layer 112. The first insulating layer 111 and the second insulating layer 112 are both located between the first wiring layer 121 and the second wiring layer 122, in which the first wiring layer 121 is disposed on the lower surface of the first insulating layer 111, whereas the second wiring layer 122 is disposed on the upper surface of the second insulating layer 112, as shown in FIGS. 1B and 1C.

In the present embodiment, the wiring substrate 100 can further include a third insulating layer 113, a fourth insulating layer 114, a third wiring layer 123 and a fourth wiring layer 124. The fourth insulating layer 114 covers the second wiring layer 122, and the third insulating layer 113 covers the first wiring layer 121. Taking FIGS. 1B and 1C for example, the fourth insulating layer 114 covers the upper surface of the second wiring layer 122, and the third insulating layer 113 covers the lower surface of the first wiring layer 121, so that the first wiring layer 121 and the second wiring layer 122 are both located between the third insulating layer 113 and the fourth insulating layer 114. The third insulating layer 113 and the fourth insulating layer 114 are both located between the third wiring layer 123 and the fourth wiring layer 124, where the third wiring layer 123 is disposed on the lower surface of the third insulating layer 113, and the fourth wiring layer 124 is disposed on the upper surface of the fourth insulating layer 114.

The wiring substrate 100 can further include two insulation protective layers 119 which may be solder masks. The third wiring layer 123 and the fourth wiring layer 124 are both located between the insulation protective layers 119, while the insulation protective layers 119 cover the third wiring layer 123 and the fourth wiring layer 124 respectively. Each of the third wiring layer 123 and the fourth wiring layer 124 can include at least one pad (not shown), and the insulation protective layers 119 can cover the pads of the third wiring layer 123 and the fourth wiring layer 124 not completely, or not cover the pads of the third wiring layer 123 and the fourth wiring layer 124, so that the pads of the third wiring layer 123 and the fourth wiring layer 124 can be exposed and thus electrically connected to an electronic component, such as a discrete component or an integrated circuit (IC).

In the present embodiment, the wiring substrate 100 includes a high-frequency wiring layer 129, a first wiring layer 121, a second wiring layer 122, a third wiring layer 123 and a fourth wiring layer 124, so the wiring substrate 100 has five wiring layers. However, in other embodiment, the wiring substrate 100 can have three wiring layers: the high-frequency wiring layer 129, the first wiring layer 121 and the second wiring layer 122, not include the third wiring layer 123 and the fourth wiring layer 124, that is, the third wiring layer 123 and the fourth wiring layer 124 shown in FIGS. 1B and 1C can be omitted.

In other embodiment, the wiring substrate 100 can have more than five wiring layers. For example, the wiring substrate 100 can further include a fifth wiring layer and a sixth wiring layer (all not shown), in which the first wiring layer 121, the second wiring layer 122, the third wiring layer 123 and the fourth wiring layer 124 are all located between the fifth wiring layer and the sixth wiring layer. In addition, it is necessary to note that the wiring substrate 100 shown in FIG. 1A is drawn by omitting the second wiring layer 122, the fourth insulating layer 114, the fourth wiring layer 124 and the insulation protective layer 119 covering the fourth wiring layer 124, so as to show the structure of the second insulating layer 112.

The first insulating layer 111 has a first opening 111$h$, and the second insulating layer 112 has a second opening 112$h$, in which the first opening 111$h$ aligns with the second opening 112$h$. For example, both the first opening 111$h$ and the second opening 112h have the same sizes and the shapes substantially, so that the sidewall 111w of the first opening 111h and the sidewall 112w of the second opening 112h can be flush with each other substantially. Hence, the first opening 111h and the second opening 112h can communicate, so that the first opening 111h and the second opening 112h can form a hollow cavity C11 which can contain the air.

The wiring substrate 100 further includes a first conductive layer 131 and a second conductive layer 132, where the first conductive layer 131 is formed on the sidewall 111w of the first opening 111h, and the second conductive layer 132 is formed on the sidewall 112w of the second opening 112h. The first conductive layer 131 and the second conductive layer 132 take the shape of a ring apiece and can completely cover the sidewalls 111w and 112W respectively, as the second conductive layer 132 shown in FIG. 1A.

The second insulating layer 112 includes a second peripheral layer 112a and a plurality of second supporting pillars 112c, in which the second peripheral layer 112a has a second opening 112h, and the second supporting pillars 112c are located in the second opening 112h. Hence, the second peripheral layer 112a can surround the second supporting pillars 112c. In addition, the second peripheral layer 112a and the second supporting pillars 112c are separated from each other. In other words, each of the second supporting pillars 112c cannot touch or be connected to the second peripheral layer 112a directly, as shown in FIG. 1A.

The first insulating layer 111 includes a first peripheral layer 111a and a plurality of first supporting pillars 111c, in which the first peripheral layer 111a has the first opening 111h, and the first supporting pillars 111c is located in the first opening 111h. Hence, the first peripheral layer 111a can surrounding the first supporting pillars 111c. In addition, the first supporting pillars 111c and the second supporting pillars 112c can overlap respectively, so the positions of the second supporting pillars 112c in FIG. 1A are equal to the positions of the first supporting pillars 111c, in which the first peripheral layer 111a and the first supporting pillars 111c are separated from each other.

In addition, the spacing between the first supporting pillars 111c can be equal, whereas the spacing between the second supporting pillars 112c can be equal. Hence, the distance between two adjacent first supporting pillars 111c can be substantially constant, while the distance between two adjacent second supporting pillars 112c also can be substantially constant. In other words, the first supporting pillars 111c and the second supporting pillars 112c both can be distributed on a high-frequency trace 129t uniformly.

The high-frequency wiring layer 129 is located between the first peripheral layer 111a and the second peripheral layer 112a, so that the first peripheral layer 111a and the second peripheral layer 112a are both disposed on the high-frequency wiring layer 129 where the first peripheral layer 111a and the second peripheral layer 112a are located on two opposite sides of the high-frequency wiring layer 129 respectively. The high-frequency wiring layer 129 includes at least one high-frequency trace 129t which has a first surface 129a and a second surface 129b opposite to the first surface 129a.

The high-frequency trace 129t is located in the hollow cavity C11, where the first opening 111h exposes the first surface 129a, and the second opening 112h exposes the second surface 129b. Since the high-frequency trace 129t is located in the hollow cavity C11, both the first peripheral layer 111a and the second peripheral layer 112a do not cover the high-frequency trace 129t. The first supporting pillars 111c are disposed on the first surface 129a, and the second supporting pillars 112c are disposed on the second surface 129b. Hence, the high-frequency trace 129t is located between the first supporting pillars 111c and the second supporting pillars 112c, where the first surface 129a is covered partially by the first insulating layer 111, and the second surface 129b is covered partially by the second insulating layer 112.

The first surface 129a has a first smooth surface (not labeled) which is not covered by the first insulating layer 111, whereas the second surface 129b has a second smooth surface (not labeled) which is not covered by the second insulating layer 112. The first smooth surface and the second smooth surface have the roughness ranging between 0.1 μm and 2 μm apiece. Hence, the surface of the high-frequency trace 129t that is not covered by the first insulating layer 111 and the second insulating layer 112 can be smooth and has the roughness ranging between 0.1 μm and 2 μm, so as to effectively reduce adverse influence of skin effect on the high-frequency trace 129t, thereby reducing the attenuation of the high-frequency signal in the high-frequency trace 129t.

Moreover, since the high-frequency trace 129t is located in the hollow cavity C11 which can contain the air, the air can wrap most of the high-frequency trace 129t. Since the air has the relative permittivity that is lower than the relative permittivity of each of LCP and teflon (where the relative permittivity of the air is about 1), the attenuation of the high-frequency signal transmitted in the high-frequency trace 129t due to dielectric loss is effectively reduced, so as to improve the transmission quality of the wiring substrate 100.

In addition, the first supporting pillars 111c and the second supporting pillars 112c can support the high-frequency trace 129t, so that the high-frequency trace 129t can be suspended in the hollow cavity C11. When the wiring substrate 100 is the rigid wiring board, the high-frequency trace 129t can be kept flat by the support of the first supporting pillars 111c and the second supporting pillars 112c, so as to prevent an impedance mismatch caused by bending the high-frequency trace 129t, thereby reducing the attenuation of the high-frequency signal.

When the wiring substrate 100 is the flexible wiring board and bent, the high-frequency trace 129t can be bent as the wiring substrate 100 is bent. The first supporting pillars 111c and the second supporting pillars 112c can support the bent high-frequency trace 129t, so that all of the high-frequency trace 129t, a first return layer 121b and a second return layer 122b can be kept separated from each other and maintain the spacing between the high-frequency trace 129t and both the first return layer 121b and the second return layer 122b, so that the spacing will not be changed dramatically to affect the transmission quality of the high-frequency trace 129t.

It is worth mentioning that although the first supporting pillars 111c and the second supporting pillars 112c are disposed on the high-frequency trace 129t, each of the first supporting pillars 111c and the second supporting pillars 112c has a fairly small size, while the first supporting pillars 111c and the second supporting pillars 112c are not continuously distributed on the high-frequency trace 129t. Hence, a reflection of signal or a standing wave caused by the first supporting pillars 111c and the second supporting pillars 112c have quite little influence on the high-frequency signal. In other words, the first supporting pillars 111c and the second supporting pillars 112c disposed on the high-frequency trace 129t have extremely little influence on the high-frequency signal that can be omitted.

The first conductive layer 131 is formed on the sidewall 111w of the first opening 111h, and the second conductive layer 132 is formed on the sidewall 112w of the second opening 112h. Accordingly, both the first conductive layer 131 and the second conductive layer 132 surround the high-frequency trace 129t in the hollow cavity C11, so that the first conductive layer 131 and the second conductive layer 132 have the function of electromagnetic shielding and can shield external electromagnetic waves interfering the high-frequency trace 129t. In addition, the first conductive layer 131 and the second conductive layer 132 also can reduce the dielectric loss caused by the first peripheral layer 111a and the second peripheral layer 112a, so as to reduce the attenuation of the high-frequency signal in the high-frequency trace 129t.

It is worth mentioning that when the wiring substrate 100 is the flexible wiring board, the thickness of each of the first conductive layer 131 and the second conductive layer 132 can range between 5 μm and 10 μm, so as to facilitate bending the wiring substrate 100. When the wiring substrate 100 is the rigid wiring board, each of the first conductive layer 131 and the second conductive layer 132 can have the thickness of 10 μm or more than 10 μm. Accordingly, it not only improves the abilities of both the first conductive layer 131 and the second conductive layer 132 to shield the external electromagnetic waves, but also significantly reduces the dielectric loss caused by the first peripheral layer 111a and the second peripheral layer 112a, thereby effectively reducing the attenuation of the high-frequency signal.

The high-frequency wiring layer 129 can further include a peripheral metal layer 129p surrounding the high-frequency trace 129t, where the high-frequency trace 129t is not electrically connected to the peripheral metal layer 129p, so that the high-frequency trace 129t cannot touch the peripheral metal layer 129p directly. In addition, the peripheral metal layer 129p can be sandwiched between the first peripheral layer 111a and the second peripheral layer 112a, and can surround the hollow cavity C11. In other words, the peripheral metal layer 129p can have an opening (not labeled in FIGS. 1A to 10) which communicates with the first opening 111h and the second opening 112h, and the high-frequency trace 129t is located in the abovementioned opening.

The first wiring layer 121 includes the first return layer 121b, and the second wiring layer 122 includes the second return layer 122b. The first opening 111h and the second opening 112h are located between the first return layer 121b and the second return layer 122b. Hence, the hollow cavity C11 can be distributed between the first return layer 121b and the second return layer 122b. The high-frequency trace 129t, the first return layer 121b and the second return layer 122b overlap, where the first supporting pillars 111c are located between the high-frequency trace 129t and the first return layer 121b, and the second supporting pillars 112c are located between the high-frequency trace 129t and the second return layer 122b, as shown FIGS. 1B and 10.

The high-frequency trace 129t, the first return layer 121b and the second return layer 122b do not touch each other, so that the high-frequency trace 129t is not electrically connected to the first return layer 121b and the second return layer 122b. In other words, the high-frequency trace 129t, the first return layer 121b and the second return layer 122b are separated each other, so that the high-frequency trace 129t is electrically insulated from the first return layer 121b and the second return layer 122b. Accordingly, the high-frequency signal transmitted by the high-frequency trace 129t cannot be transmitted to the first return layer 121b and the second return layer 122b directly by conductor.

Referring to FIG. 1C, the first return layer 121b has a first glossy surface G21 and a first matte surface M21, where the first matte surface M21 is opposite to the first glossy surface G21. The first glossy surface G21 faces the first surface 129a and the first smooth surface thereof, whereas the first matte surface M21 touches the third insulating layer 113 directly. The first matte surface M21 is a rough surface, so that a bonding force with enough strength can be generated between the first matte surface M21 and the third insulating layer 113. Thus, the first return layer 121b can be attached to the third insulating layer 113 firmly, so the first return layer 121b is difficult to separate from the third insulating layer 113.

The second return layer 122b has a second glossy surface G22 and a second matte surface M22, in which the second matte surface M22 is opposite to the second glossy surface G22. The second glossy surface G22 faces the second surface 129b and the second smooth surface thereof, whereas the second matte surface M22 touches the fourth insulating layer 114 directly. Like the first matte surface M21, the second matte surface M22 is also a rough surface, so that a bonding force with enough strength also can be generated between the second matte surface M22 and the fourth insulating layer 114. Thus, the second return layer 122b also can be attached to the fourth insulating layer 114 firmly, so the second return layer 122b is difficult to separate from the fourth insulating layer 114.

The first glossy surface G21 and the second glossy surface G22 have the roughness ranging between 0.5 μm and 2 μm apiece. During the high-frequency trace 129t transmitting the high-frequency signal, the first glossy surface G21 of the first return layer 121b and the second glossy surface G22 of the second return layer 122b can introduce return signals transmitted along return paths. Since the first glossy surface G21 and the second glossy surface G22 have the roughness ranging between 0.5 μm and 2 μm apiece, thereby effectively reducing the attenuation of the return signal in the first glossy surface G21 and the second glossy surface G22, so as to improve the transmission quality of the wiring substrate 100.

Referring to FIGS. 1A and 10, the second wiring layer 122 further include a signal wiring layer 122a, in which the signal wiring layer 122a is located at the peripheral region of the second return layer 122b and not electrically connected to the second return layer 122b. The wiring substrate 100 further includes a plurality of conductive columns 142, where the conductive columns 142 are disposed in the second insulating layer 112 and connected to the high-frequency trace 129t and the signal wiring layer 122a, so that the high-frequency trace 129t can be electrically connected to the signal wiring layer 122a via the conductive columns 142.

Each of the conductive columns 142 is not electrically connected to the second return layer 122b, so that the conductive columns 142 does not touch the second return layer 122b, and the return signal in the second return layer 122b will not be transmitted through the conductive columns 142. In addition, the conductive columns 142 are located in at least two of the second supporting pillars 112c. Taking FIGS. 1A and 1C for example, the conductive columns 142 can be located in the leftmost and rightmost second supporting pillars 112c respectively, so that the conductive columns 142 can be connected to two opposite sides of the high-frequency trace 129t.

The wiring substrate 100 can further includes a plurality of shielding conductive columns 141. The shielding conductive columns 141 pass through the first insulating layer 111 and the second insulating layer 112, and are located at the peripheral regions of both of the first opening 111h and the second opening 112h. The shielding conductive columns 141 can be connected to the first wiring layer 121 and the second wiring layer 122, but not connected to the high-frequency trace 129t. The shielding conductive columns 141 all can be electrically insulated from the high-frequency trace 129t, so that the high-frequency signal in the high-frequency trace 129t cannot be transmitted to any one of the shielding conductive columns 141 directly by conductor. In addition, the shielding conductive columns 141 also have the function of electromagnetic shielding, so as to shield the external electromagnetic waves interfering the high-frequency trace 129t.

Figure 2A:
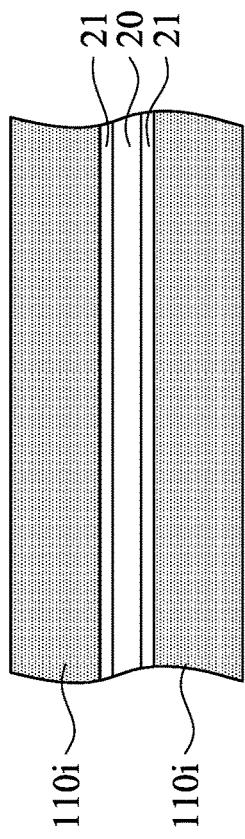
Figure 2B:
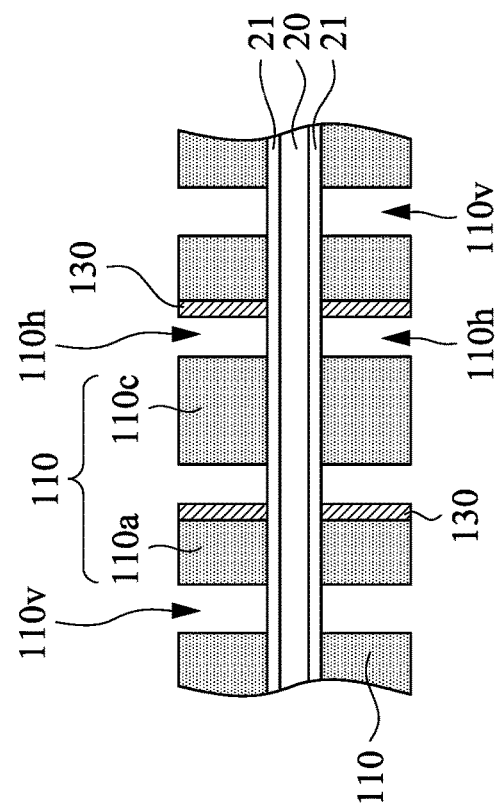

FIGS. 2A to 2J are schematic views of a method of manufacturing the wiring substrate shown in FIG. 1A. In the method of manufacturing the wiring substrate 100, at least one of the first insulating layer 111, the second insulating layer 112 and the high-frequency wiring layer 129 can be formed at first. FIGS. 2A to 2B disclose the steps of forming at least one of the first insulating layer 111 and the second insulating layer 112, whereas FIGS. 2C to 2F disclose the steps of forming the high-frequency wiring layer 129. This embodiment herein describes the step of forming at least one of the first insulating layer 111 and the second insulating layer 112 at first, but in other embodiment, the high-frequency wiring layer 129 can be formed at first. Thus, the present embodiment does not limit the formation sequence of the first insulating layer 111, the second insulating layer 112 and the high-frequency wiring layer 129.

Referring to FIG. 2A, in the steps of forming at least one of the first insulating layer 111 and the second insulating layer 112, an insulating composite substrate 210 can be provided, in which the insulating composite substrate 210 includes an insulating layer 110i, a supporting plate 20 and a release layer 21 located between the insulating layer 110i and the supporting plate 20. Taking FIG. 2A for example, the insulating composite substrate 210 can include two insulating layers 110i, one supporting plate 20 and two release layers 21, in which each of the release layers 21 is sandwiched between the supporting plate 20 and one of the insulating layers 110i. The insulating layers 110i touch and are temporarily attached to the release layers 21 respectively, so that each of the insulating layers 110i can be separated from the supporting plate 20 by using the release layer 21.

Referring to FIG. 2B, afterward, the insulating layers 110i are patterned, so as to form a plurality of insulating layers 110, where the insulating layers 110i can have photosensitivity and be photoimageable dielectric (PID) materials, for example. Hence, patterning the insulating layers 110i can be exposure and development. In addition, in other embodiment, patterning the insulating layers 110i also can be laser ablation and not limited to exposure and development.

Each of the insulating layers 110 can be the first insulating layer 111 or the second insulating layer 112. Specifically, each of the insulating layers 110 can have openings 110h, in which each of the openings 110h may be the first opening 111h or the second opening 112h. Moreover, each of the insulating layers 110 can include a plurality of peripheral layers 110a and a plurality of supporting pillars 110c, in which the peripheral layer 110a can be the first peripheral layer 111a or the second peripheral layer 112a, and the supporting pillars 110c can be the first supporting pillars 111c or the second supporting pillars 112c.

Therefore, each of the insulating layers 110i can form the first insulating layer 111 or the second insulating layer 112. Hence, one insulating composite substrate 210 can form two first insulating layers 111, two second insulating layers 112, or one first insulating layer 111 and one second insulating layer 112. In addition, in other embodiment, the insulating composite substrate 210 can include one insulating layer 110i, one supporting plate 20 and one release layer 21 only, so that the release layer 21 and the insulating layer 110i at the same side of the supporting plate 20 in FIG. 2A can be omitted.

Afterward, a plurality of conductive layers 130 are formed on the sidewalls of the openings 110h respectively, where each of the conductive layers 130 can be the first conductive layer 131 or the second conductive layer 132. Forming the conductive layers 130 can be electroless plating, or include electroless plating and electroplating. After the conductive layers 130 are formed, the insulating layers 110 are patterned, so as to form a plurality of holes 110v. Patterning the insulating layers 110 can be exposure and development, or laser ablation.

Referring to FIG. 2C, in the process of forming the high-frequency wiring layer 129, first, a metal composite substrate 220 can be provided, in which the metal composite substrate 220 includes a metal layer 120i, a supporting plate 20 and a release layer 21 located between the metal layer 120i and the supporting plate 20. Taking FIG. 2C for example, the metal composite substrate 220 can include two metal layers 120i, one supporting plate 20 and two release layers 21, where each of the release layers 21 is sandwiched between the supporting plate 20 and one of the metal layers 120i.

The metal layers 120i touch and are temporarily attached to the release layers 21 respectively, so each of the metal layers 120i can be separated from the supporting plate 20 by using the release layer 21. In addition, each of the metal layers 120i has a matte surface M12 and a glossy surface G12 opposite to the matte surface M12, where the glossy surfaces G12 can directly touch the release layers 21 respectively, so as to expose the matte surface M12.

Figure 2E:
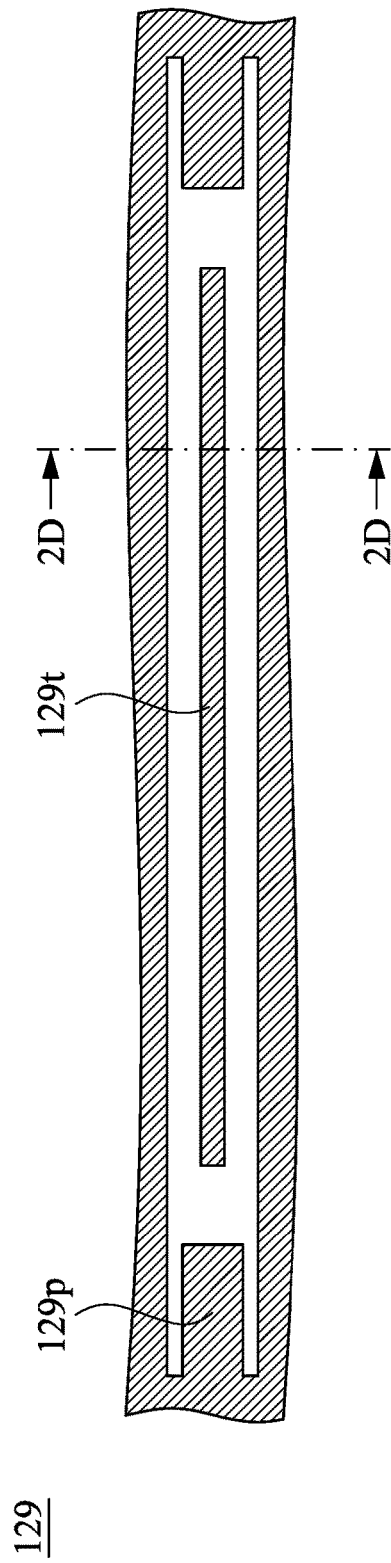

Referring to FIGS. 2D and 2E, FIG. 2D is a schematic cross-sectional view along a line 2D-2D shown in FIG. 2E. Afterward, the metal layer 120i is patterned, so as to form at least one high-frequency wiring layer 129, where patterning the metal layer 120i can be exposure and development. In the present embodiment, the high-frequency wiring layer 129 can be formed after patterning each metal layer 120i, so patterning the metal layers 120i can form a plurality of high-frequency wiring layers 129. In addition, in FIG. 2D, each high-frequency wiring layer 129 can include the high-frequency trace 129t and the peripheral metal layer 129p, where the peripheral metal layer 129p has a plurality of through holes 129v for the formation of the shielding conductive columns 141, and FIG. 2E omits the through holes 129v.

Figure 2F:
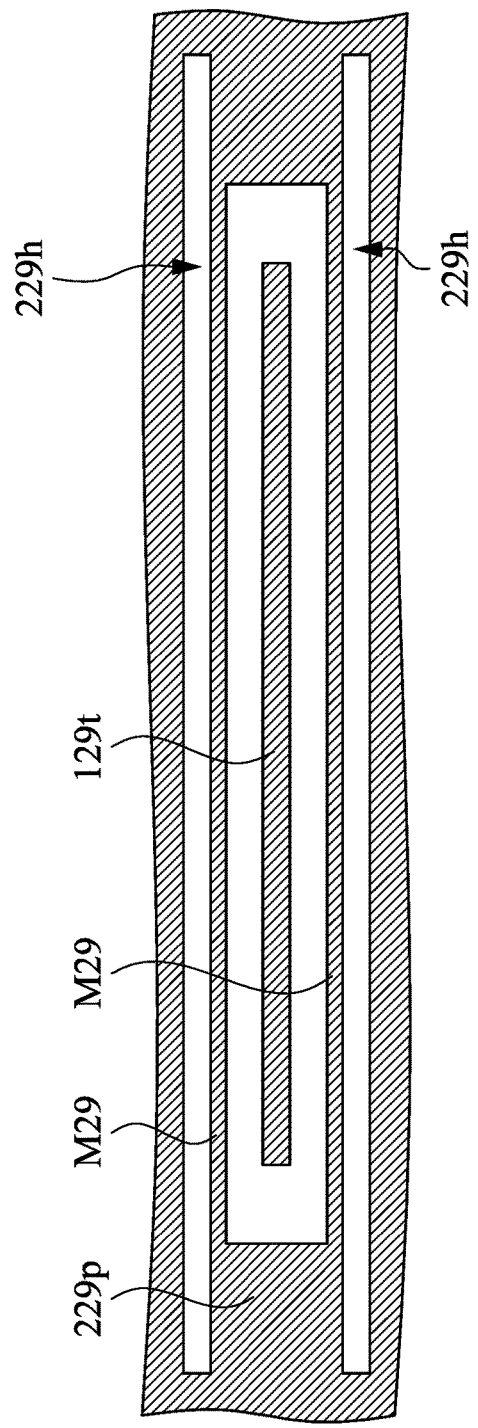

Referring to FIG. 2F, which depicts a high-frequency wiring layer 229 in other embodiment, the high-frequency wiring layer 229 also includes the high-frequency trace 129t and the peripheral metal layer 229p. Unlike the high-frequency wiring layer 129 in FIG. 2E, the peripheral metal layer 229p includes two metal lines M29, in which the high-frequency trace 129t is located between the metal lines M29, while the high-frequency trace 129t and the metal lines M29 are arranged side by side. The metal lines M29 also have the function of electromagnetic shielding, so as to help to shield external electromagnetic interference. In addition, in the high-frequency wiring layer 229, the peripheral metal layer 229p can have a pair of trenches 229h, where the metal lines M29 are located between the trenches 229h, and each of the trenches 229h can extend along the metal lines M29.

Referring to FIGS. 2D and 2G, afterward, the high-frequency wiring layers 129 are separated from the supporting plate 20, and the high-frequency wiring layer 129 separated from the supporting plate 20 is compressed to the insulating layer 110. Before compressing the high-frequency wiring layer 129 to the insulating layer 110, the insulating layer 110 can be roughened, so that the insulating layer 110 has a rough surface to facilitate bonding the high-frequency wiring layer 129 and the insulating layer 110 together. Roughening the insulating layer 110 has a plurality of methods. In the present embodiment, the surface of the insulating layer 110 can be roughened by using laser. Alternatively, the surface of the insulating layer 110 also can be roughened by chemistry.

Referring to FIGS. 2G and 2H, afterward, the other insulating layer 110 is compressed to the high-frequency wiring layer 129, and the insulating layers 110 and the supporting plate 20 in FIG. 2G are separated, so as to dispose the first insulating layer 111 and the second insulating layer 112 on the high-frequency wiring layer 129. The other insulating layer 110 for being compressed to the high-frequency wiring layer 129 can be made by another insulating composite substrate 210. Alternatively, in FIG. 2G, the upper insulating layer 110 can be used as the first insulating layer 111, whereas the lower insulating layer 110 can be used as the second insulating layer 112. The lower insulating layer 110 does not be compressed to the high-frequency wiring layer 129 at first, that is, the lower high-frequency wiring layer 129 in FIG. 2G can be removed, and the lower insulating layer 110 separated from the supporting plate 20 can be compressed to the upper insulating layer 110 and the high-frequency wiring layer 129 directly, so as to form the first insulating layer 111 and the second insulating layer 112.

After the first insulating layer 111 and the second insulating layer 112 are disposed on the high-frequency wiring layer 129, it can perform surface treatment on the surface of the high-frequency wiring layer 129 that is not covered by the first insulating layer 111 and the second insulating layer 112, so that the high-frequency wiring layer 129 has the first smooth surface and the second smooth surface, where the first smooth surface and the second smooth surface are not covered by the first insulating layer 111 and the second insulating layer 112 respectively. The surface treatment can be performed by using laser.

Figure 2I:
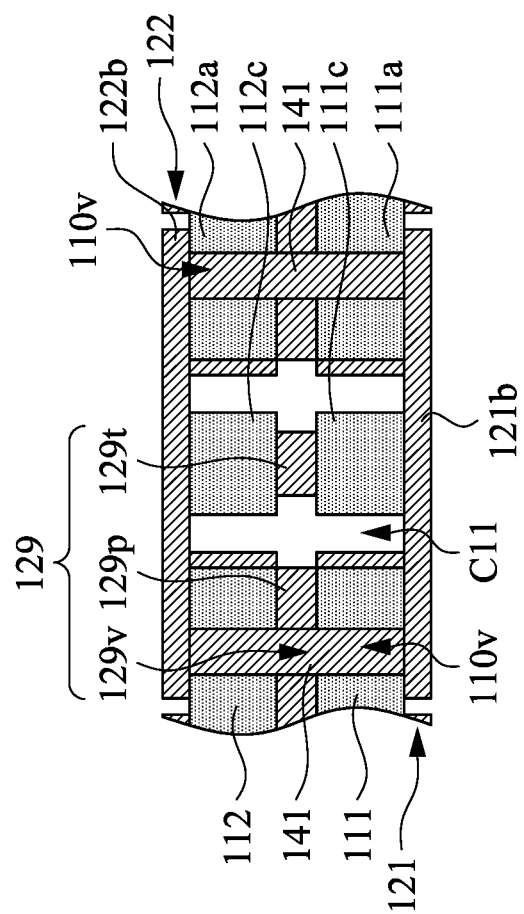
Figure 2J:
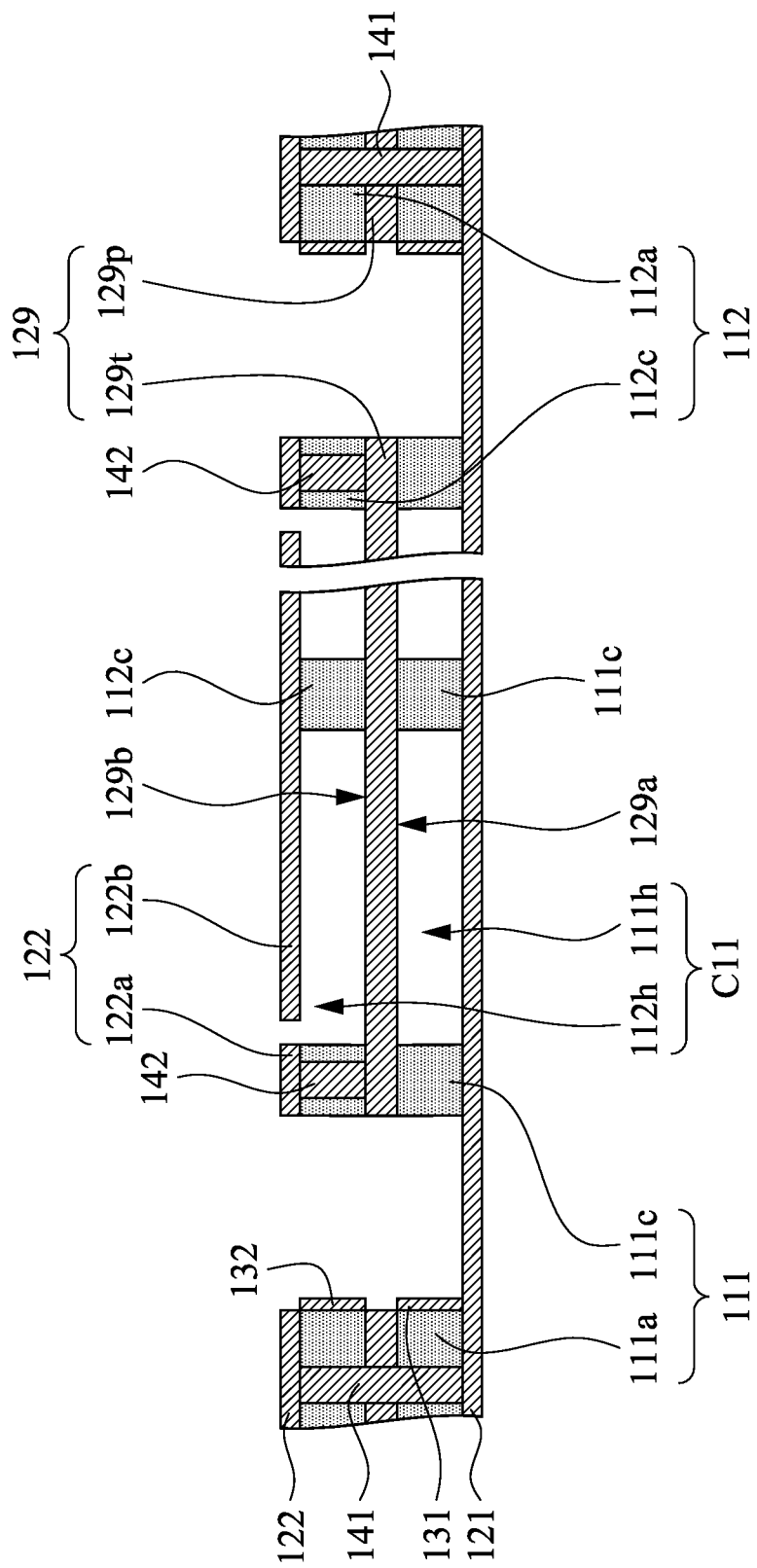

Referring to FIGS. 2I and 2J, FIG. 2J is basically a schematic cross-sectional view along a line 1C-1C shown in FIG. 1A. Afterward, the first wiring layer 121 is formed on the first insulating layer 111, the second wiring layer 122 is formed on the second insulating layer 112, and the shielding conductive columns 141 are formed in the holes 110v and the through holes 129v. Forming the shielding conductive columns 141 can include plating through hole (PTH), and both the first wiring layer 121 and the second wiring layer 122 can be made of metal foil via semi-additive process and microetching.

The surfaces of both the first wiring layer 121 and the second wiring layer 122 in contact with first insulating layer 111 and the second insulating layer 112 can be roughened, so as to facilitate bonding the first wiring layer 121 and the first insulating layer 111 together, and bonding the second wiring layer 122 and the second insulating layer 112 together. Afterward, the third insulating layer 113, the fourth insulating layer 114, the third wiring layer 123, the fourth wiring layer 124 and the insulation protective layers 119 are formed, as shown in FIGS. 1A to 10. At this time, the wiring substrate 100 is basically complete.

Figure 3C:
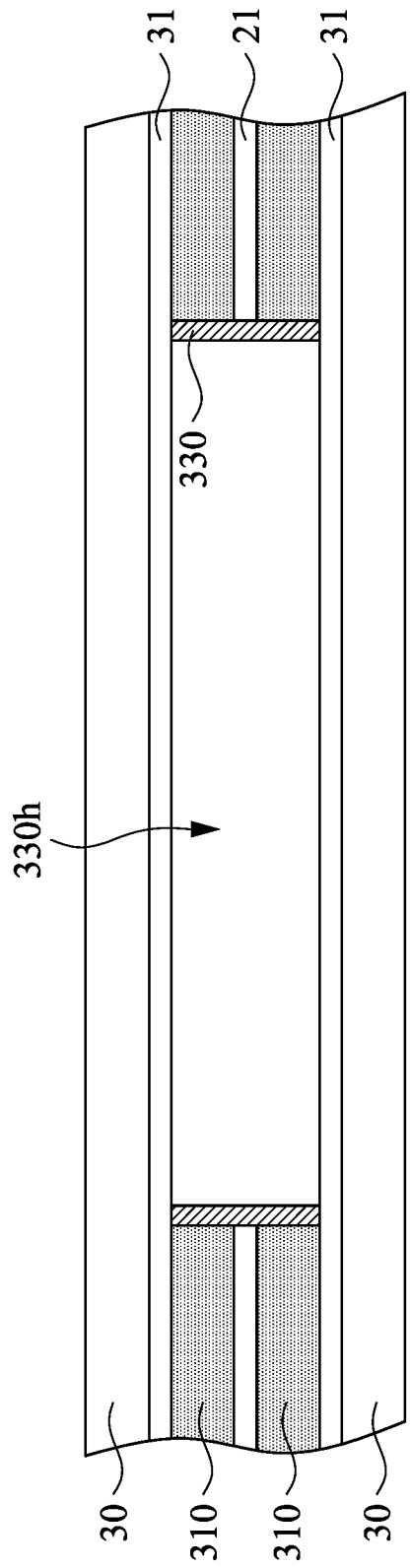

FIGS. 3A to 3I are schematic cross-sectional views of a method of manufacturing a wiring substrate according to another embodiment of this disclosure. Referring to FIG. 3A, first, an insulating-layer stacked substrate 319 including a plurality of insulating layers 310i and a plurality of release layers 21 is provided, in which the insulating layers 310i and the release layers 21 are stacked alternately, and the insulating layers 310i are located between two of the release layers 21. Unlike the insulating layer 110i, the insulating layer 310i may be a prepreg or resin and not have any photosensitivity.

Referring to FIG. 3B, afterward, a hole 330h is formed in the insulating-layer stacked substrate 319, so as to form a plurality of insulating layers 310, where the hole 330h is formed by passing through the insulating layers 310i and the release layers 21, and the hole 330h can be formed by stamping or routing. Afterward, a metal layer 330i is formed on the sidewall of the hole 330h and outermost two release layers 21, where the formation of the metal layer 330i can be electroless plating, and the metal layer 330i can be a nickel layer, gold layer or silver layer.

Referring to FIGS. 3B and 3C, after forming the metal layer 330i, the outermost two of release layers 21 are removed, and the insulating layers 310 and at least one release layer 21 remain, where the remaining release layer 21 can be located between two of the insulating layers 310. In addition, after removing the outermost two of release layers 21, the part of the metal layer 330i is also removed, so as to form a metal layer 330 only covering the sidewall of the hole 330h.

Afterward, the insulating layers 310 and the release layers 21 are disposed on the holding board 30. In the embodiment of FIG. 3C, two holding boards 30 can be provided, and both the insulating layers 310 and the release layers 21 are sandwiched between two holding boards 30. Meanwhile, the hole 330h is encapsulated between two holding boards 30. The holding boards 30 can be connected to the insulating layers 310 by using two release layers 31, as shown in FIG. 3C.

Figure 3D:
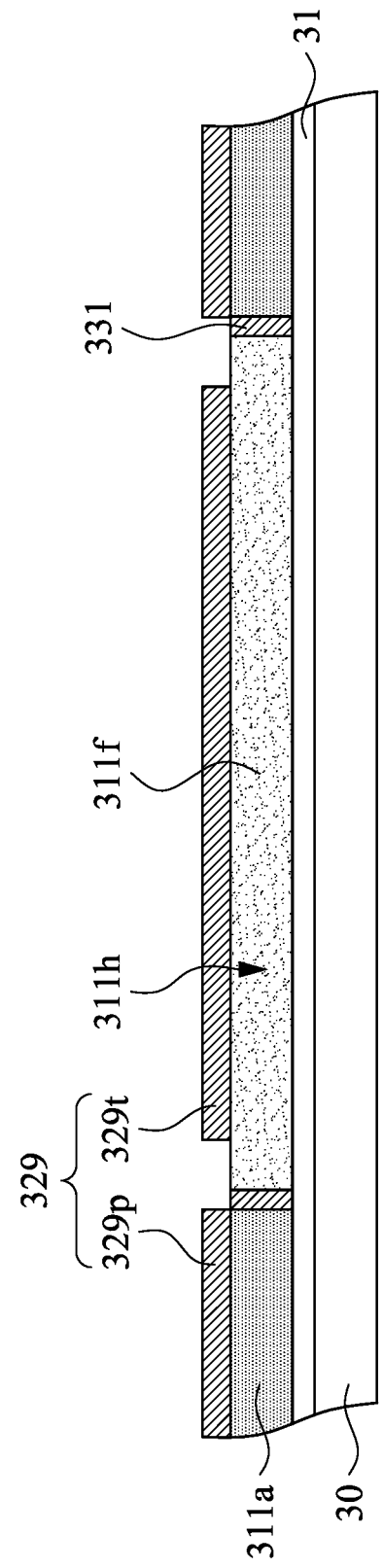

Referring to FIGS. 3C and 3D, after the insulating layers 310 and the release layers 21 are disposed on the holding board 30, at least one insulating layer 310, the release layers 21 and the part of the metal layer 330 are removed, and one of the insulating layer 310 remains, so as to form a first peripheral layer 311a and a first conductive layer 331. The first peripheral layer 311a is disposed on the release layer 31 and the holding board 30, and has a first opening 311h. Afterward, a first dielectric material 311f fills the first opening 311h, where the first dielectric material 311f can have photosensitivity and is different from the material of the first peripheral layer 311a.

Afterward, a high-frequency wiring layer 329 is formed on the first dielectric material 311f, where the high-frequency wiring layer 329 includes a high-frequency trace 329t and a peripheral metal layer 329p. Forming the high-frequency wiring layer 329 can be compressing a metal foil (e.g., Copper foil) to the first dielectric material 311f and the first peripheral layer 311a at first, where the metal foil can have a surface with the low roughness, so that the high-frequency trace 329t can have a smooth surface to reduce the adverse influence of skin effect. Afterward, the metal foil is patterned, in which patterning the metal foil can be exposure and development. Alternatively, the high-frequency wiring layer 329 also can be made by semi-additive process and microetching.

Figure 3E:
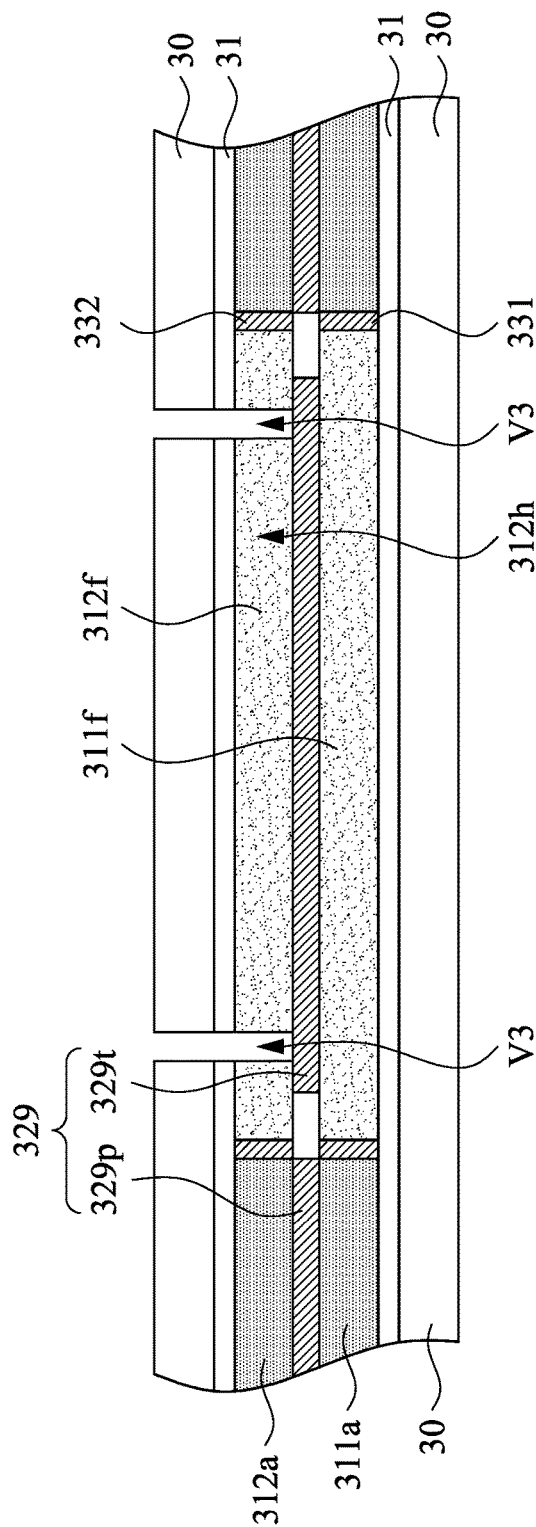

Referring to FIG. 3E, afterward, a second peripheral layer 312a is formed on the high-frequency wiring layer 329, in which the second peripheral layer 312a has a second opening 312h. The formation and the material of the second peripheral layer 312a can be the same as those of the first peripheral layer 311a, and the second peripheral layer 312a can be disposed on the release layer 31 and the holding board 30 at first. Afterward, the second peripheral layer 312a with the release layer 31 and the holding board 30 is compressed to the high-frequency wiring layer 329, as show in FIG. 3E.

Before the second peripheral layer 312a is compressed to the high-frequency wiring layer 329, a second dielectric material 312f can fill the second opening 312h, where the materials of the first dielectric material 311f and the second dielectric material 312f can be the same. After filling the second dielectric material 312f, the second peripheral layer 312a is compressed to the high-frequency wiring layer 329. Afterward, the holding board 30 can be drilled to form a plurality of holes V3 extending from the holding board 30 to the high-frequency wiring layer 329 through the second peripheral layer 312a, where the hole V3 can be formed by mechanical drilling or laser drilling.

Figure 3F:
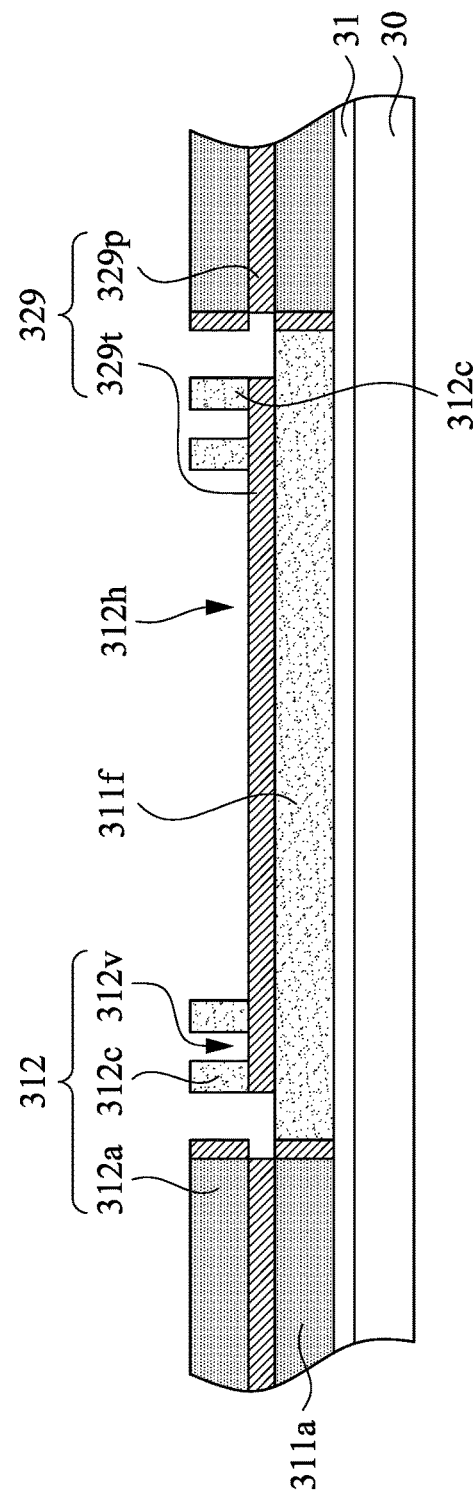

Referring to FIG. 3F, afterward, the holding board 30 and the release layer 31 adjacent to the second peripheral layer 312a and the second dielectric material 312f are removed, so as to expose the second dielectric material 312f and the second peripheral layer 312a. Afterward, the second dielectric material 312f is patterned, so as to form a plurality of second supporting pillars 312c, where at least two second supporting pillars 312c can have through holes 312v respectively. The second dielectric material 312f can have photosensitivity, and patterning the second dielectric material 312f can be exposure and development, or laser ablation. After forming the second supporting pillars 312c, a second insulating layer 312 including the second peripheral layer 312a and the second supporting pillars 312c is formed.

Figure 3G:
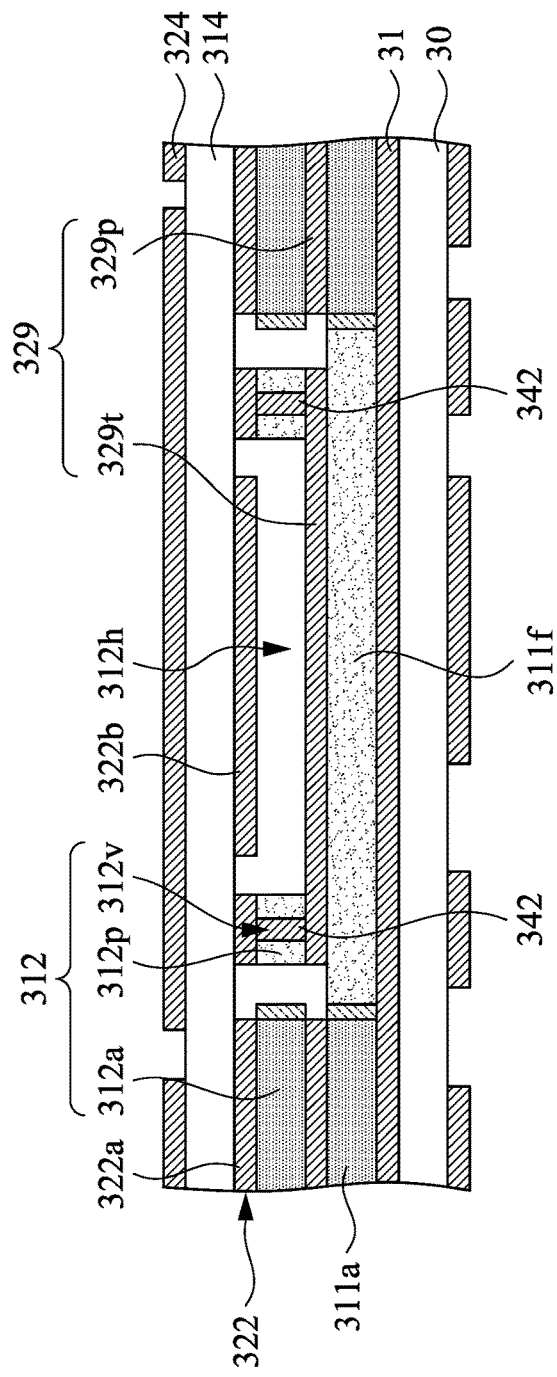

Referring to FIG. 3G, afterward, a second wiring layer 322 is formed on the second insulating layer 312, and a plurality of conductive columns 342 are formed in the through holes 312v. The second wiring layer 322 including a signal wiring layer 322a and a second return layer 322b can be made by performing photolithography and etching on metal foil, and the conductive columns 342 can be formed by PTH. Both materials of the first conductive layer 331 and the second conductive layer 332 can be different from the material of the second wiring layer 322, so that a suitable etchant can be selected for etching during the formation of the second wiring layer 322, thereby preventing the first conductive layer 331 and the second conductive layer 332 from damage caused by the etchant. Afterward, a fourth insulating layer 314 and a fourth wiring layer 324 can be formed in sequence.

Figure 3H:
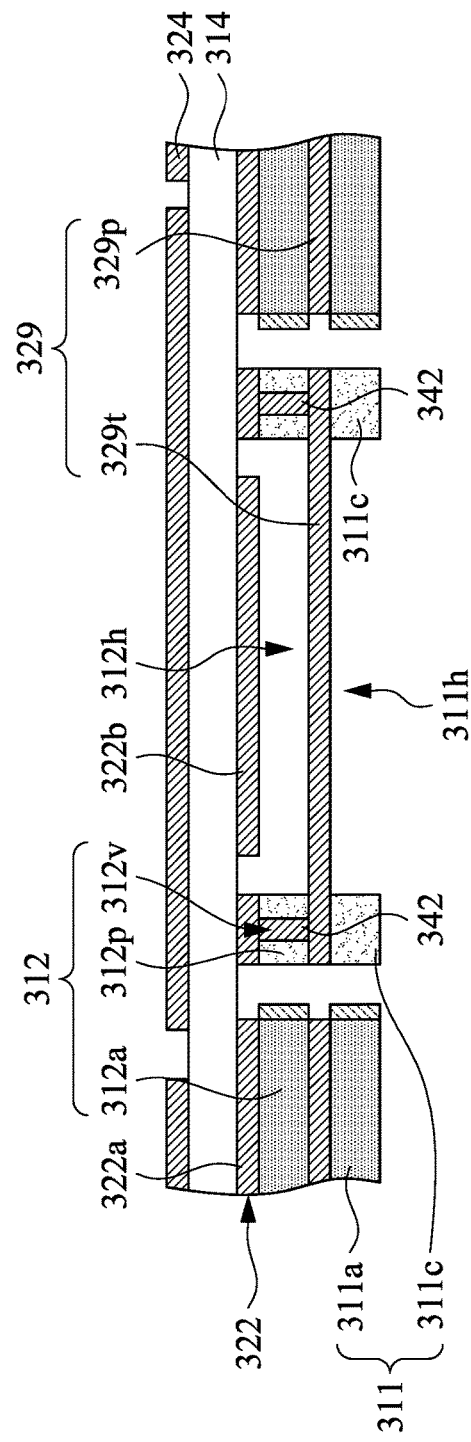

Referring to FIG. 3H, afterward, the lower holding board 30 and release layer 31 are removed to expose the first dielectric material 311f. Next, the first dielectric material 311f is patterned to form a plurality of first supporting pillars 311c, in which patterning the first dielectric material 311f can be exposure and development, and a first insulating layer 311 including the first peripheral layer 311a and the first supporting pillars 311c is formed.

The materials of the first dielectric material 311f and the second dielectric material 312f can be the same, both materials of the first peripheral layer 311a and the second peripheral layer 312a can be the same, and the first dielectric material 311f is different from the material of the first peripheral layer 311a. Thus, the material of each of the first supporting pillars 311c is different from the material of the first peripheral layer 311a, whereas the material of each of the second supporting pillars 312c is also different from the material of the second peripheral layer 312a.

Figure 3I:
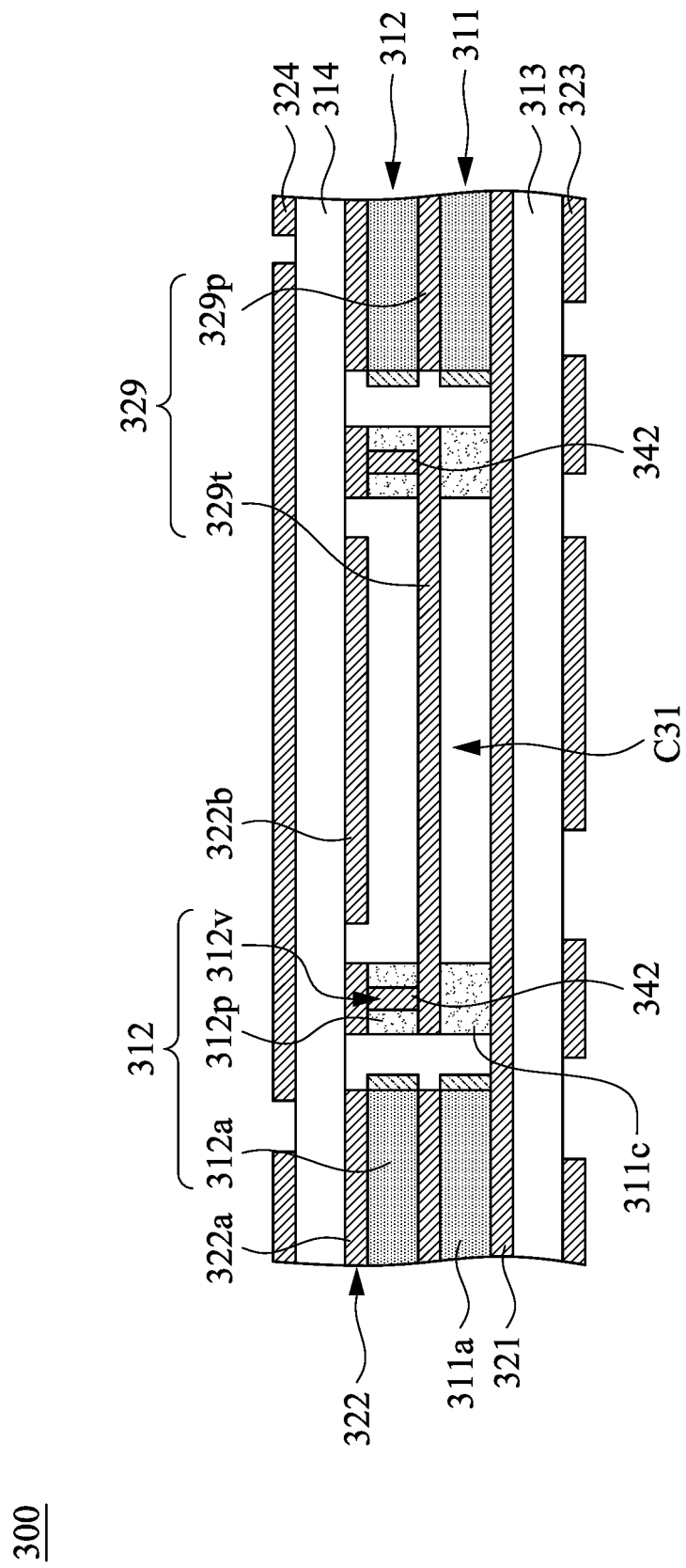

Referring to FIG. 3I, afterward, a first wiring layer 321 is formed on the first insulating layer 311, in which the formation of both the first wiring layer 321 and the second wiring layer 322 can be the same, and the first wiring layer 321 includes a first return layer (not labeled). After forming the first wiring layer 321, a third insulating layer 313, a fourth insulating layer 314, a third wiring layer 323 and a fourth wiring layer 324 can be formed. At this time, the wiring substrate 300 is basically complete.

It is worth mentioning that in the process of forming the first wiring layer 321 and the second wiring layer 322, a tape can be used to cover the glossy surfaces of the metal foil which subsequently form both the first return layer and the second return layer 322b, so as to protect the glossy surfaces of the metal foil from being roughened and to maintain the roughness of the glossy surfaces, thereby improving the transmission quality of the wiring substrate 300.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A wiring substrate, comprising:
a first insulating layer, having a first opening;
a first conductive layer, formed on a sidewall of the first opening;
a second insulating layer, having a second opening;
a second conductive layer, formed on a sidewall of the second opening;
a high-frequency wiring layer, sandwiched between the first insulating layer and the second insulating layer, wherein the high-frequency wiring layer comprises:
a high-frequency trace, having a first surface and a second surface opposite to the first surface, the first opening exposing the first surface, and the second opening exposing the second surface, wherein the first surface has a first smooth surface which is not covered by the first insulating layer, and the second surface has a second smooth surface which is not covered by the second insulating layer,
wherein both the first smooth surface and the second smooth surface have a roughness ranging between 0.1 µm and 2 µm apiece;
a first wiring layer, comprising a first return layer;
a second wiring layer, comprising a second return layer and a signal wiring layer, wherein the signal wiring layer is located at a peripheral region of the second return layer, and both the first insulating layer and the second insulating layer are located between the first wiring layer and the second wiring layer, wherein the first opening and the second opening are located between the first return layer and the second return layer and form a hollow cavity, wherein the high-frequency trace is located in the hollow cavity, and the high-frequency trace, the first return layer and the second return layer overlap and do not touch each other; and a plurality of conductive columns, disposed in the second insulating layer, wherein the conductive columns are connected to the high-frequency trace and the signal wiring layer, not connected to the second return layer.

2. The wiring substrate of claim 1, wherein the first return layer has a first glossy surface facing the first smooth surface, and the second return layer has a second glossy surface facing the second smooth surface, wherein the first glossy surface and the second glossy surface have a roughness between 0.5 μm and 2 μm apiece.

3. The wiring substrate of claim 1, further comprising:
a third insulating layer, covering the first wiring layer;
a fourth insulating layer, covering the second wiring layer, wherein the first wiring layer and the second wiring layer are both located between the third insulating layer and the fourth insulating layer;
a third wiring layer; and
a fourth wiring layer, wherein the third insulating layer and the fourth insulating layer are both located between the third wiring layer and the fourth wiring layer.

4. The wiring substrate of claim 3, wherein the first return layer has:
a first glossy surface, facing the first smooth surface; and
a first matte surface, opposite to the first glossy surface and directly touching the third insulating layer, wherein the second return layer has:
a second glossy surface, facing the second smooth surface; and
a second matte surface, opposite to the second glossy surface and directly touching the fourth insulating layer.

5. The wiring substrate of claim 1, further comprising:
a plurality of shielding conductive columns, passing through the first insulating layer and the second insulating layer, and connected to the first wiring layer and the second wiring layer, wherein the shielding conductive columns are located at two peripheral regions of the first opening and the second opening, and not electrically connected to the high-frequency trace.

6. The wiring substrate of claim 1, wherein the first insulating layer comprises:
a plurality of first supporting pillars, disposed on the first surface and located in the first opening, wherein the first supporting pillars are located between the high-frequency trace and the first return layer; and a first peripheral layer, disposed on the high-frequency wiring layer and surrounding the first supporting pillars, wherein the first peripheral layer and the first supporting pillars are separated from each other, and the first peripheral layer does not cover the high-frequency trace.

7. The wiring substrate of claim 6, wherein a material of each of the first supporting pillars is different from a material of the first peripheral layer.

8. The wiring substrate of claim 6, wherein a spacing between the first supporting pillars is equal.

9. The wiring substrate of claim 6, wherein the second insulating layer comprises:
a plurality of second supporting pillars, disposed on the second surface and located in the second opening, wherein the second supporting pillars are located between the high-frequency trace and the second return layer, and the conductive columns are located in at least two of the second supporting pillars respectively; and
a second peripheral layer, disposed on the high-frequency wiring layer and surrounding the second supporting pillars, wherein the second peripheral layer and the second supporting pillars are separated from each other, and the second peripheral layer does not cover the high-frequency trace, wherein the high-frequency wiring layer is located between the first peripheral layer and the second peripheral layer.

10. The wiring substrate of claim 9, wherein a material of each of the second supporting pillars is different from a material of the second peripheral layer.

11. The wiring substrate of claim 9, wherein the first supporting pillars and the second supporting pillars overlap respectively.

12. The wiring substrate of claim 9, wherein a spacing between the second supporting pillars is equal.

13. The wiring substrate of claim 1, wherein both materials of the first conductive layer and the second conductive layer are different from both materials of the first wiring layer and the second wiring layer.

14. The wiring substrate of claim 1, wherein the high-frequency wiring layer further comprises:
a peripheral metal layer, surrounding the high-frequency trace, wherein the high-frequency trace is not electrically connected to the peripheral metal layer.

15. The wiring substrate of claim 14, wherein the peripheral metal layer comprises:
two metal lines, wherein the high-frequency trace is located between the metal lines, and the high-frequency trace and the metal lines are arranged side by side.

* * * * *